US012598927B2

(12) United States Patent
Kub et al.

(10) Patent No.: US 12,598,927 B2
(45) Date of Patent: Apr. 7, 2026

(54) METHODS OF FORMING SEMICONDUCTOR DEVICES INCLUDING SELF-ALIGNED P-TYPE AND N-TYPE DOPED REGIONS

(71) Applicant: The Government of the United States of America, as represented by the Secretary of the Navy, Arlington, VA (US)

(72) Inventors: Francis J. Kub, Arnold, MD (US); Travis J. Anderson, Alexandria, VA (US); Mona A. Ebrish, Nashville, TN (US); Alan G. Jacobs, Rockville, MD (US); Karl D. Hobart, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 346 days.

(21) Appl. No.: 18/222,177

(22) Filed: Jul. 14, 2023

(65) Prior Publication Data

US 2025/0149338 A1     May 8, 2025

Related U.S. Application Data

(60) Provisional application No. 63/391,334, filed on Jul. 22, 2022.

(51) Int. Cl.
*H10D 30/66*     (2025.01)
*H01L 21/22*     (2006.01)
(Continued)

(52) U.S. Cl.
CPC ...... *H01L 21/2225* (2013.01); *H01L 21/2254* (2013.01); *H01L 21/2258* (2013.01);
(Continued)

(58) Field of Classification Search
None
See application file for complete search history.

(56) References Cited

U.S. PATENT DOCUMENTS 8,518,808 B2    8/2013    Feigelson et al.
9,543,168 B2    1/2017    Feigelson et al.
(Continued)

FOREIGN PATENT DOCUMENTS

DE          102023211617 A1 *  5/2025  ......... H10D 30/0291

OTHER PUBLICATIONS

Czernecki et al., "Hydrogen diffusion in GaN:Mg and GaN:Si," Journal of Alloys and Compounds, Netherlands, vol. 747, May 30, 2018, pp. 354-358.
(Continued)

*Primary Examiner* — Christine S. Kim
*Assistant Examiner* — Tien Tran
(74) *Attorney, Agent, or Firm* — US Naval Research Laboratory; Scott C. Hatfield

(57)     ABSTRACT

According to some embodiments of the present disclosure, methods of forming a semiconductor device on a semiconductor layer having opposing first and second surfaces are disclosed. An n-type doped region including an n-type dopant may be formed at the first surface of the semiconductor layer. A p-type dopant source layer including a p-type dopant may be formed on the n-type doped region. The p-type dopant may be diffused from the p-type dopant source layer through the n-type doped region into the semiconductor layer to form a p-type doped region of the semiconductor layer, and the p-type doped region of the semiconductor layer may be between the n-type doped region and the second surface of the semiconductor layer. After diffusing the p-type dopant, the p-type dopant source layer may be removed.

18 Claims, 12 Drawing Sheets

(51) Int. Cl.

| | |
|---|---|
| *H01L 21/225* | (2006.01) |
| *H01L 21/265* | (2006.01) |
| *H10D 30/01* | (2025.01) |
| *H10D 62/85* | (2025.01) |
| *H01L 21/20* | (2006.01) |

(52) U.S. Cl.

CPC .. *H01L 21/26546* (2013.01); *H01L 21/26553* (2013.01); *H10D 30/025* (2025.01); *H10D 30/66* (2025.01); *H10D 62/8503* (2025.01); *H01L 21/2015* (2013.01)

(56) References Cited

U.S. PATENT DOCUMENTS

| | | | | |
|---|---|---|---|---|
| 11,201,058 | B2 | 12/2021 | Anderson et al. | |
| 11,415,518 | B2 | 8/2022 | Anderson et al. | |
| 11,532,478 | B2 | 12/2022 | Anderson et al. | |
| 2012/0252196 | A1* | 10/2012 | Clark | H01L 21/2255 |
| | | | | 257/E21.135 |
| 2013/0075748 | A1* | 3/2013 | Bour | H10D 62/854 |
| | | | | 257/E29.093 |
| 2016/0218200 | A1* | 7/2016 | Carta | H01L 23/291 |
| 2017/0278950 | A1* | 9/2017 | Tanaka | H10D 30/63 |
| 2017/0278952 | A1* | 9/2017 | Oka | H10D 62/854 |
| 2018/0019129 | A1* | 1/2018 | Matsuyama | H10D 62/85 |
| 2019/0019679 | A1* | 1/2019 | Iguchi | H01L 21/0495 |
| 2019/0252186 | A1* | 8/2019 | Aktas | H10D 8/051 |
| 2019/0393038 | A1* | 12/2019 | Voss | H01L 21/3245 |
| 2021/0389126 | A1 | 12/2021 | Gallagher et al. | |
| 2022/0059352 | A1 | 2/2022 | Anderson et al. | |
| 2023/0197534 | A1 | 6/2023 | Mastro et al. | |
| 2023/0207323 | A1 | 6/2023 | Anderson et al. | |
| 2024/0313089 | A1* | 9/2024 | Tanaka | H10D 30/0291 |
| 2024/0387641 | A1* | 11/2024 | Ohuchi | H10D 84/143 |

OTHER PUBLICATIONS

Hite et al., "Influence of HVPE substrates on homoepitaxy of GaN grown by MOCVD," Journal of Crystal Growth, Netherlands, vol. 498, Sep. 15, 2018, pp. 352-356.

* cited by examiner

METHODS OF FORMING SEMICONDUCTOR DEVICES INCLUDING SELF-ALIGNED P-TYPE AND N-TYPE DOPED REGIONS

CROSS-REFERENCE TO RELATED APPLICATIONS

This Application is a Nonprovisional Utility Patent Application and claims the benefit of priority under 35 U.S.C. Sec. 119 based on U.S. Provisional Patent Application No. 63/391,334 filed on Jul. 22, 2022. The disclosure of Provisional Application No. 63/391,334 and all references cited herein are hereby incorporated in their entirety by reference into the present disclosure.

FEDERALLY SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #211122-US1.

TECHNICAL FIELD

The present disclosure relates to methods of forming semiconductor devices and more particularly to methods of forming doped regions in semiconductor layers.

BACKGROUND OF THE INVENTION

Gallium Nitride GaN and related wide- and ultra-wide bandgap III-N semiconductor materials/alloys (e.g., Aluminum Gallium Nitride AlGaN, Indium Aluminum Gallium Nitride InAlGaN, Aluminum Nitride AlN, etc.) may have favorable properties for power devices, including tunable direct bandgaps (e.g., tunable in the range of 0.7 eV to 6.1 eV), high saturation velocities, high mobilities, and/or high breakdown fields. As used herein, a III-N semiconductor material/alloy may be defined as a semiconductor material/alloy including at least one metal from the 13th column of the periodic table (e.g., at least one of gallium, aluminum, indium, and/or boron) and nitrogen (N).

These material systems may exhibit improved Baliga Figures of Merit (BFOM) for power switching compared to conventional Silicon (Si) and/or Silicon Carbide (SIC) technologies. Technological challenges such as reliable substrate production and doping control in drift layers suitable for high voltage (e.g., in the range of 1 kV to 20 kV) are also being addressed, enabling renewed commercial interest in vertical power device technology such as P-i-N diodes, junction barrier Schottky (JBS) diodes, p-n junction gated field effect transistors (JFET), current aperture vertical electron transistors (CAVET), double diffused metal oxide semiconductor field effect transistors (DMOS), and trench Metal Oxide Semiconductor Field Effect Transistors (MOSFET). Significant technical challenges may remain, however, in selective-area doping technology to achieve complex high performance device structures without numerous etch and regrowth steps, which may not be planar and which may introduce undesired impurities at regrowth interfaces as well as reduced crystal/material quality.

In conventional power semiconductor device technologies such as Si and SiC, selective area dopant species may be introduced by either ion implantation or by diffusion into the semiconductor from a solid source. In classical Si device technology, dopants are placed in contact with the surface either by direct deposition or by utilizing paper-based sources containing the dopant species. Following this step, an annealing operation is performed at elevated temperature. During the annealing operation, the dopant species may diffuse from a semi-infinite source following well-defined classical equations. Following initial coating of the semiconductor surface, the dopant species are further diffused into the semiconductor as a limited source in the "drive-in" anneal, also following well-defined classical equations. The desired dopant profiles may be achieved by careful control of the time and the temperature for multiple anneal cycles. Alternatively, the initial deposition of the dopant species may be achieved by ion implantation, followed by a drive-in anneal. Selective-area doping may be achieved by using a combination of photomasks, dielectric masks, and/or metals to control the location of dopant species. Many years of technological development have realized variants on these processes for precise junction depth control.

Many issues for forming P-type diffused regions in III-nitride semiconductor materials, however, may remain. Anneal temperatures greater than 1300° C. may be required to anneal and activate magnesium ions implanted as dopants into III-nitride semiconductor materials. For example, a III-nitride semiconductor material surface may decompose at temperatures greater than 950° C. Moreover, a capping layer/layers may be used to reduce/prevent decomposition of III-nitride semiconductor materials during high temperature annealing operations. Even with the use of capping layers, lattice damage created by the magnesium ion implantation may lead to low activation percentages of the magnesium dopant.

III-N semiconductor material systems may present unique challenges, which may make selective-area doping a challenge. Most notably, control over p-type doping may be difficult due to the high ionization energy of Magnesium (Mg) and the known tendency to form electrically inactive complexes with other residual impurities such as hydrogen. Second, selective-area doping by ion implantation may be challenging and may require annealing at high temperature and/or elevated pressure to be successful. This may be due to the high temperatures required to repair lattice damage from ion implantation and/or to drive dopant species to appropriate substitutional lattice sites. Typically, annealing operations may need to be performed in an overpressure environment to mitigate decomposition of the crystal at such temperatures. Multicycle rapid thermal annealing (MRTA), symmetric multicycle rapid thermal annealing (SMRTA), and related annealing profiles and capping layers have been developed to address/mitigate these effects and to enable dopant activation for p-n junction formation. Limitations of ion implantation technology combined with the known diffusivity of Mg species, however, may make the formation of highly doped near-surface layers difficult. Simultaneously, the presence of thin (e.g., less than 30 nm), heavily doped surface layers (e.g., with dopant concentrations greater than $10^{19}$ cm$^{-3}$), may be used to provide low resistance ohmic contacts, particularly for p-type layers/regions and associated metallization.

SUMMARY OF THE INVENTION

This summary is intended to introduce in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

According to some embodiments of inventive concepts, methods are provided to form a semiconductor device on a semiconductor layer having opposing first and second surfaces. An n-type doped region including an n-type dopant is formed at the first surface of the semiconductor layer, and a p-type dopant source layer including a p-type dopant is formed on the n-type doped region. The p-type dopant is diffused from the p-type dopant source layer through the n-type doped region into the semiconductor layer to form a p-type doped region of the semiconductor layer, wherein the p-type doped region of the semiconductor layer is between the n-type doped region and the second surface of the semiconductor layer. After diffusing the p-type dopant, the p-type dopant source layer is removed.

The semiconductor layer may include a Group III nitride semiconductor layer. For example, the Group III nitride semiconductor layer may be at least one of gallium nitride (GaN), aluminum gallium nitride (AlGaN), indium aluminum gallium nitride (InAlGaN), and/or aluminum nitride (AlN).

The semiconductor layer may be an n-type semiconductor layer. Moreover, the n-type doped region, the p-type doped region, and the n-type semiconductor layer may define an N—P—N structure after diffusing the p-type dopant.

The n-type dopant may include at least one of silicon and/or germanium.

The p-type dopant may include magnesium, and the p-type dopant source layer may include magnesium. For example, forming the p-type dopant source layer including magnesium may include at least one of forming a metal layer including magnesium, forming a layer of a metal alloy including magnesium, forming a layer of a semiconductor alloy including magnesium, implanting magnesium into a layer of a material, forming a layer of a semiconductor including magnesium, forming a layer of silicon including magnesium, forming a layer of a group-III nitride including magnesium, forming a layer of a metal oxide including magnesium, forming a layer of a metal nitride including magnesium, forming a layer of a metal fluoride including magnesium, forming a layer of a metal phosphide including magnesium, forming a layer of a metal sulfide including magnesium, forming a layer of a single crystal material including magnesium, forming a layer of a polycrystalline material including magnesium, and/or forming a layer of an amorphous material including magnesium. Moreover, forming the p-type dopant source layer may include forming the p-type dopant source layer using at least one of physical vapor deposition (PVD), electron beam evaporation, sputtering, pulsed laser deposition, chemical vapor deposition (CVD), and/or metal organic chemical vapor deposition (MOCVD).

In addition, a capping layer may be formed on the p-type dopant source layer after forming the p-type dopant source layer and before diffusing the p-type dopant, and the capping layer may be removed after diffusing the p-type dopant and before removing the p-type dopant source layer. Moreover, the capping layer may include at least one of silicon oxide, silicon nitride, silicon carbide, aluminum nitride, aluminum oxide, aluminum oxynitride, carbon, palladium, platinum, gold, nickel, tungsten, molybdenum, and/or a refractory material.

According to some other embodiments of inventive concepts, methods are provided to form a semiconductor device on a semiconductor layer having opposing first and second surfaces. A diffusion blocking layer is formed on the first surface of the semiconductor layer, wherein the diffusion blocking layer has an opening there through defining an area of the first surface of the semiconductor layer. After forming the diffusion blocking layer, an n-type doped region including an n-type dopant is formed at the area of the first surface of the semiconductor layer defined by the opening. A p-type dopant source layer including a p-type dopant is formed on the diffusion blocking layer and in the opening of the diffusion blocking layer on the n-type doped region. The p-type dopant is diffused from the p-type dopant source layer through the n-type doped region into the semiconductor layer to form a p-type doped region of the semiconductor layer, wherein the p-type doped region of the semiconductor layer is between the n-type doped region and the second surface of the semiconductor layer. After diffusing the p-type dopant, the p-type dopant source layer is removed.

Forming the n-type doped region may include implanting ions of the n-type dopant through the opening of the diffusion blocking layer into the area of the semiconductor layer defined by the opening to form the n-type doped region in the semiconductor layer.

Forming the n-type doped region may include selectively forming an epitaxial n-type semiconductor layer including the n-type dopant on the area of the semiconductor layer defined by the opening to form the n-type doped region on the semiconductor layer.

After removing the p-type dopant source layer, the diffusion blocking layer may be removed.

The diffusion blocking layer may include at least one of silicon oxide, silicon nitride, silicon carbide, aluminum nitride, aluminum oxide, aluminum oxynitride, carbon, and/or a refractory material.

According to still other embodiments of inventive concepts, methods are provided to form a semiconductor device on a semiconductor layer having opposing first and second surfaces. A layer of an epitaxial n-type semiconductor material including the n-type dopant is formed on the semiconductor layer. A layer of a p-type dopant source material including the p-type dopant is formed on the layer of the epitaxial n-type semiconductor material. After forming the layers of the epitaxial n-type semiconductor material and the p-type dopant source material, the layers of the epitaxial n-type semiconductor material and the p-type dopant source material are patterned to form an n-type doped region at the first surface of the semiconductor layer and to form a p-type dopant source layer on the n-type doped region, wherein the n-type doped region is between the p-type dopant source layer and the semiconductor layer. The p-type dopant is diffused from the p-type dopant source layer through the n-type doped region into the semiconductor layer to form a p-type doped region of the semiconductor layer, wherein the p-type doped region of the semiconductor layer is between the n-type doped region and the second surface of the semiconductor layer. After diffusing the p-type dopant, the p-type dopant source layer is removed.

After forming the p-type dopant source layer and before diffusing the p-type dopant, a capping layer may be formed on the p-type dopant source layer and on portions of the semiconductor layer adjacent to the p-type dopant source layer. After diffusing the p-type dopant and before removing the p-type dopant source layer, the capping layer may be removed. Moreover, the capping layer may include at least one of silicon oxide, silicon nitride, silicon carbide, aluminum nitride, aluminum oxide, aluminum oxynitride, carbon, palladium, platinum, gold, nickel, tungsten, molybdenum, and/or a refractory material.

According to some other embodiments of inventive concepts, a method of forming a semiconductor device on a semiconductor layer having opposing first and second surfaces is provided. A diffusion blocking layer is formed on the first surface of the semiconductor layer, wherein the diffusion blocking layer has an opening there through defining an area of the first surface of the semiconductor layer. A p-type dopant source layer including a p-type dopant is formed on the diffusion blocking layer and on the area of the first surface of the semiconductor layer defined by the opening. The p-type dopant from the p-type dopant source layer is diffused into the area of the first surface of the semiconductor layer to form a p-type doped region of the semiconductor layer. After diffusing the p-type dopant to form the p-type doped region, the p-type dopant source layer is removed. After removing the p-type dopant source layer, a spacer is formed on a sidewall of the diffusion blocking layer to narrow the opening and thereby define a reduced area of the first surface of the semiconductor layer. After forming the spacer, an n-type doped region including an n-type dopant is formed at the reduced area of the first surface of the semiconductor layer, wherein the p-type doped region of the semiconductor layer is between the n-type doped region and the second surface of the semiconductor layer.

For example, forming the n-type doped region may include implanting ions of the n-type dopant into the reduced area of the semiconductor layer defined by the diffusion blocking layer and the spacer to form the n-type doped region in the semiconductor layer. In an alternative, forming the n-type doped region may include selectively forming an epitaxial n-type semiconductor layer including the n-type dopant on the reduced area of the semiconductor layer defined by the diffusion blocking layer and the spacer to form the n-type doped region on the semiconductor layer.

Moreover, the diffusion blocking layer and/or the spacer may be removed after forming the n-type doped region.

The diffusion blocking layer may include at least one of silicon oxide, silicon nitride, silicon carbide, aluminum nitride, aluminum oxide, aluminum oxynitride, carbon, and/ or a refractory material.

In addition, a capping layer may be formed on the p-dopant source layer after forming the p-type dopant source layer and before diffusing the p-type dopant, and the capping layer may be removed after diffusing the p-type dopant and before removing the p-type dopant source layer. The capping layer, for example, may include at least one of silicon oxide, silicon nitride, silicon carbide, aluminum nitride, aluminum oxide, aluminum oxynitride, carbon, palladium, platinum, gold, nickel, tungsten, molybdenum, and/or a refractory material.

The semiconductor layer may include a Group III nitride semiconductor layer. For example, the Group III nitride semiconductor layer may include at least one of gallium nitride (GaN), aluminum gallium nitride (AlGaN), indium aluminum gallium nitride (InAlGaN), and/or aluminum nitride (AlN).

The semiconductor layer may include an n-type semiconductor layer. Moreover, the n-type doped region, the p-type doped region, and the n-type semiconductor layer may define an N—P—N structure after diffusing the p-type dopant.

The n-type dopant may include at least one of silicon and/or germanium.

The p-type dopant may include magnesium, and the p-type dopant source layer may include magnesium. For example, forming the p-type dopant source layer including magnesium may include at least one of forming a metal layer including magnesium, forming a layer of a metal alloy including magnesium, forming a layer of a semiconductor alloy including magnesium, implanting magnesium into a layer of a material, forming a layer of a semiconductor including magnesium, forming a layer of silicon including magnesium, forming a layer of a group-III nitride including magnesium, forming a layer of a metal oxide including magnesium, forming a layer of a single crystal material including magnesium, forming a layer of a polycrystalline material including magnesium, and/or forming a layer of an amorphous material including magnesium. Moreover, forming the p-type dopant source layer may include forming the p-type dopant source layer using at least one of physical vapor deposition (PVD), electron beam evaporation, sputtering, pulsed laser deposition, chemical vapor deposition (CVD), and/or metal organic chemical vapor deposition (MOCVD).

BRIEF DESCRIPTION OF DRAWINGS

Examples of embodiments of inventive concepts may be more clearly understood from the following detailed description taken in conjunction with the accompanying drawings in which.

DETAILED DESCRIPTION OF THE INVENTION

Figure 1A:
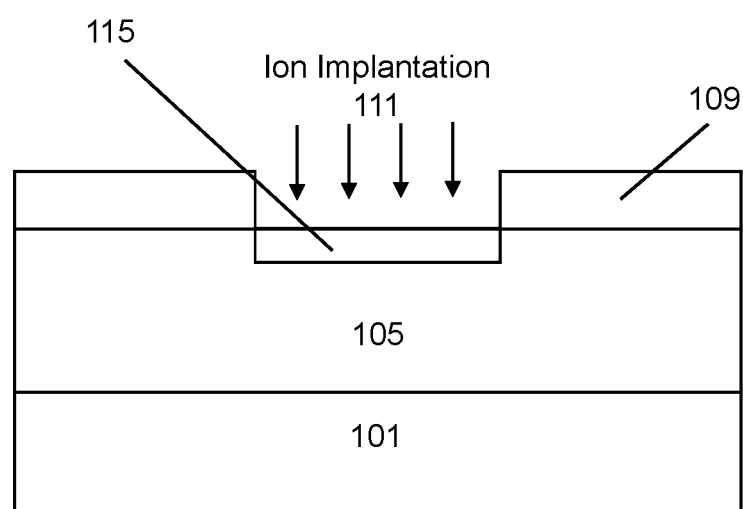
FIGS. 1A to 1D are cross sectional views illustrating operations of forming self-aligned n-type and p-type doped regions using an ion implant and diffusion according to some embodiments of inventive concepts.

Aspects and features of the present disclosure will now be described more fully with reference to the accompanying drawings. The following description shows, by way of example, combinations and configurations in which aspects, features, and embodiments of inventive concepts can be put into practice. It will be understood that the disclosed aspects, features, and/or embodiments are merely examples, and that one skilled in the art may use other aspects, features, and/or embodiments or make functional and/or structural modifications without departing from the scope of the present disclosure. Moreover, like reference numerals refer to like elements throughout, and sizes of each of the elements may be exaggerated for clarity and conveniences of explanation.

The present disclosure describes methods to laterally define N-type and P-type doped regions in group III-nitride semiconductor materials (also referred to as III-nitride semiconductor materials/alloys, III-N semiconductor materials/alloys, Group III nitride semiconductor materials/alloys, etc.) where the N-type and P-type doped regions are self-aligned with respect to each other. According to some embodiments, the P-type doped region may be formed using a magnesium containing layer as a P-type dopant diffusion source (also referred to as a magnesium diffusion source layer, a p-type dopant source, a p-type dopant source layer, or a p-type dopant diffusion source layer). The present disclosure also describes devices and/or structures formed using such methods.

In some embodiments, the N-type and P-type doped regions can be self-aligned with each other and/or the N-type doped region can be self-aligned with an edge of a gate electrode on at least one edge. In some embodiments, an optional spacer may be formed on the edge of the gate electrode.

The disclosures of U.S. Provisional Application No. 63/326,296 ("Selective-Area Doping of III-N Materials Utilizing Diffused Dopant Species and Method of Fabricating Devices") filed Apr. 1, 2022, and U.S. Utility application Ser. No. 18/193,862 ("Selective Area Diffusion Doping of III-N Materials") filed Mar. 31, 2023, are incorporated herein in their entireties by reference.

The present disclosure describes methods to laterally define N-type and P-type doped regions of III-nitride semiconductor materials that are self-aligned with each other. According to some embodiments, a layer including magnesium may be provided as a P-type dopant diffusion source. Related devices are also disclosed.

In some embodiments, the N-type and P-type doped regions can be self-aligned with each other and/or the N-type doped region can be self-aligned with the edge of a gate electrode on at least one edge. In some embodiments, an optional spacer may be formed on the edge of the gate electrode. As used herein, the term self-aligned may mean that the same photolithographic mask/etch operation is used to form both the n-type and p-type regions in/on a semiconductor layer, thereby reducing misalignment between the two regions and/or reducing cost associated with a second photolithographic mask/etch operation.

FIGS. 1A to 1D are cross sectional views illustrating operations of forming self-aligned n-type and p-type regions according to some embodiments of inventive concepts.

According to some embodiments, semiconductor layer 105 (e.g., an epitaxial layer of a group III nitride semiconductor material) may be formed on substrate 101 as shown in FIG. 1A. For example, semiconductor layer 105 may include at least one of gallium nitride (GaN), aluminum gallium nitride (AlGaN), indium aluminum gallium nitride (InAlGaN), and/or aluminum nitride (AlN). More particularly, semiconductor layer 105 may be an epitaxial gallium nitride layer formed on a gallium nitride substrate; semiconductor layer 105 may be an epitaxial high aluminum III nitride semiconductor layer formed on a gallium nitride substrate; and/or semiconductor layer 105 may be a group III nitride epitaxial semiconductor layer formed on an engineered substrate. Moreover, semiconductor layer 105 may be defined to have a first surface opposite substrate 101 and a second surface adjacent to substrate 101.

Diffusion blocking layer 109 is formed on the first surface of semiconductor layer 105, and diffusion blocking layer 109 includes an opening there through defining (e.g., exposing) an area of the first surface of semiconductor layer 105. Diffusion blocking layer 109 may include one or more of a silicon oxide layer, a silicon nitride layer, a silicon carbide layer, a layer of an amorphous material, a composite layer, a layer of a polycrystalline material, and/or one or more layers of other materials. Diffusion blocking layer 109 may be adapted to block implantation of an n-type dopant (e.g., silicon) and/or diffusion of a p-type dopant (e.g., magnesium) during a subsequent implant and/or diffusion operations.

While not shown in FIG. 1A, a protective layer may be provided on the first surface of semiconductor layer 105 between diffusion blocking layer 109 and semiconductor layer 105 and on the area of the first surface of semiconductor layer 105 exposed by the opening through diffusion blocking layer 109. Such a protective layer may protect the first surface of semiconductor layer 105 during a subsequent implant operation. If used, the protective layer may be removed after the ion implant of FIG. 1A and/or after diffusion of FIG. 1C.

After forming diffusion blocking layer 109, an ion implant 111 is used to form n-type doped region 115 including an n-type dopant at the area of the first surface of semiconductor layer 105 defined by the opening in diffusion blocking layer 109. More particularly, ions of the n-type dopant are implanted through the opening of diffusion blocking layer 109 into the area of the first surface of semiconductor layer 105 defined by the opening to form n-type doped region 115 in semiconductor layer 105. The n-type dopant, for example, may include at least one of silicon and/or germanium, and n-type doped region 115 may be at least one of a silicon and/or germanium doped region.

Figure 1B:
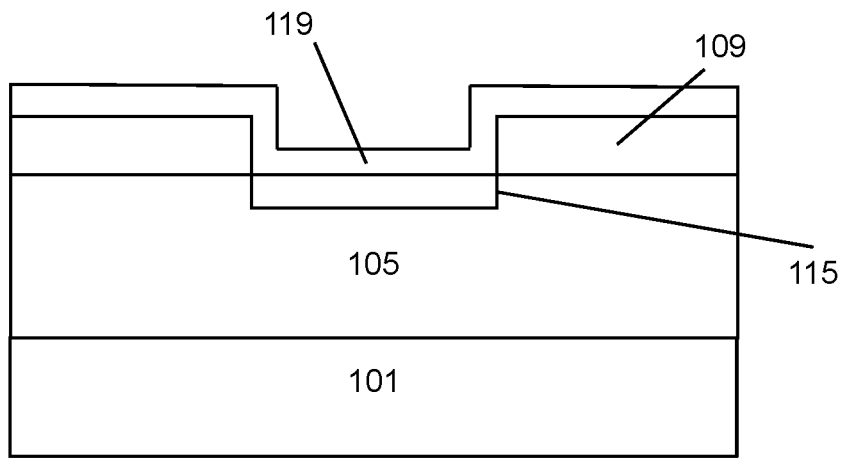

As shown in FIG. 1B, p-type dopant source layer 119 is formed on diffusion blocking layer 109 and in the opening of diffusion blocking layer 109 on n-type doped region 115. Moreover, p-type dopant source layer 119 may be a layer of a material including a p-type dopant such as magnesium. For example, p-type dopant source layer 119 may be a metal including magnesium, a metal alloy including magnesium, an oxide including magnesium (e.g., MgO), a nitride including magnesium (e.g., MgN, MgAlN, etc.), and/or a semiconductor alloy including magnesium. According to some embodiments, p-type dopant source layer 119 may be formed by implanting magnesium ions into a layer such as a semiconductor layer, a silicon layer, a group III nitride semiconductor layer, a metal oxide layer, a single crystal layer, a polycrystalline layer, and/or an amorphous layer. In addition, p-type dopant source layer 119 may be deposited by physical vapor deposition (PVD), electron beam evaporation, sputtering, pulsed laser deposition, chemical vapor deposition (CVD), and/or metal organic chemical vapor deposition (MOCVD).

Figure 1C:
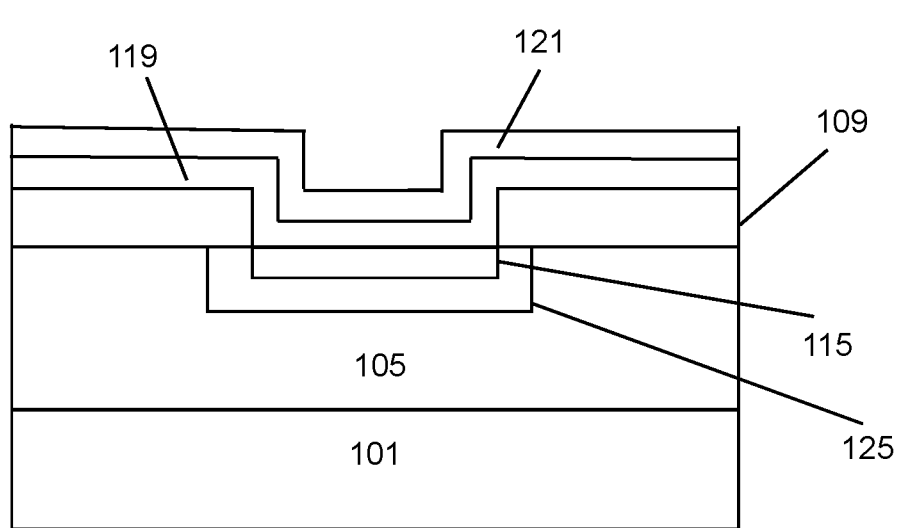

In FIG. 1C, capping layer 121 is formed on p-type dopant source layer 119, and then, the p-type dopant from p-type dopant source layer 119 is diffused through the n-type doped region into semiconductor layer 105 to form p-type doped region 125 of semiconductor layer 105 (e.g., a magnesium doped region). For example, a multicycle rapid thermal anneal may be used for the diffusion to reduce and/or prevent decomposition of a group III nitride semiconductor material of semiconductor layer 105. Because a diffusion rate of the p-type dopant may be greater than a diffusion rate of the n-type dopant, p-type doped region 125 of semiconductor layer 105 may extend between n-type doped region 115 and the second surface of semiconductor layer 105, and p-type doped region 125 may also extend laterally beyond n-type doped region 115 under diffusion blocking layer 109. Moreover, capping layer 121 may be a layer of a refractory material. Capping layer 121, for example, may reduce and/or prevent decomposition of a group III nitride semiconductor material of semiconductor layer 105 during thermal operations used to diffuse and/or anneal n-type doped region 115 and/or p-type doped region 125. Capping layer 121, for example, may include one or more of a nitride (e.g., aluminum nitride AlN, silicon nitride SiN, etc.), and/or a metal (e.g., palladium Pd, platinum Pt, gold Au, nickel Ni, tungsten W, molybdenum Mo, etc.).

Figure 1D:
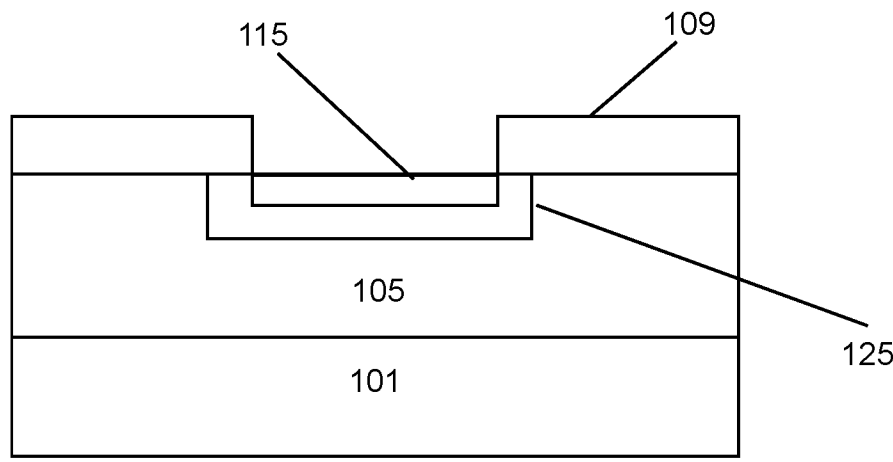

After diffusing the p-type dopant to form p-type doped region 125, capping layer 121 is removed, and then, p-type dopant source layer 119 is removed, as shown in FIG. 1D. According to some embodiments, diffusion blocking layer 109 may be removed, or diffusion blocking layer 109 may be maintained and incorporated in a final device structure. Similarly, according to some embodiments capping layer 121 may be removed, or capping layer 121 may be maintained and incorporated in a final device structure.

In FIG. 1D, substrate 101 and n-type semiconductor layer 105 may each include respective n-type semiconductor materials, p-type doped region 125 may include a p-type semiconductor material, and n-type doped region 115 may include an n-type semiconductor material. Accordingly, n-type semiconductor layer 105, p-type doped region 125, and n-type doped region 115 may define an N—P—N structure. Such an N—P—N structure may be used to provide a vertical or a horizontal transistor device.

FIGS. 2A to 2D are cross sectional views illustrating operations of forming self-aligned n-type and p-type regions according to some embodiments of inventive concepts.

Figure 2A:
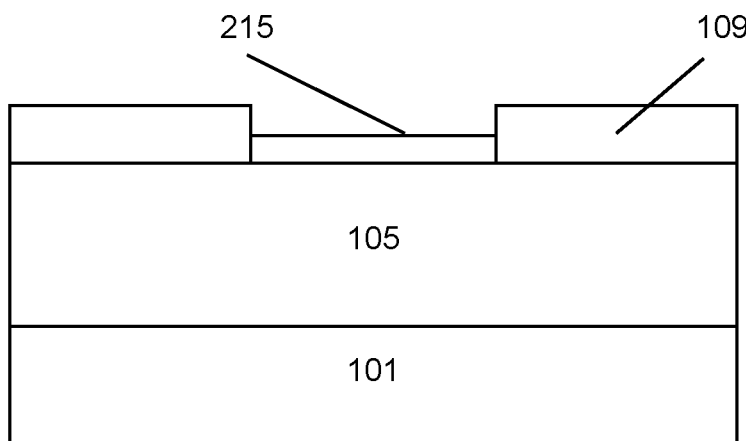
FIGS. 2A to 2D are cross sectional views illustrating operations of forming self-aligned n-type and p-type doped regions using selective epitaxy and diffusion according to some embodiments of inventive concepts.

In FIG. 2A, substrate 101, semiconductor layer 105, and diffusion blocking layer 109 may be provided as discussed above with respect to FIG. 1A. N-type doped region 215 is selectively formed as an epitaxial n-type semiconductor layer including the n-type dopant on the area of the semiconductor layer 105 defined by the opening of diffusion blocking layer 109. N-type doped region 215, for example, may include an n-type group III nitride epitaxial semiconductor layer including silicon dopant atoms and/or germanium dopant atoms.

Figure 2B:
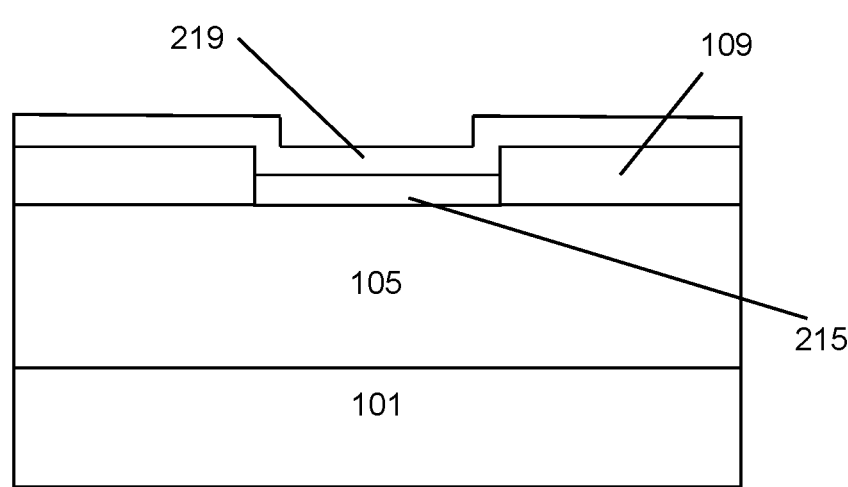

In FIG. 2B, p-type dopant source layer 219 is formed on diffusion blocking layer 109 and on n-type doped region 215 in the opening of diffusion blocking layer 109. Moreover, p-type dopant source layer 219 may be a layer of a material including a p-type dopant such as magnesium. For example, p-type dopant source layer 219 may be a metal including magnesium, a metal alloy including magnesium, and/or a semiconductor alloy including magnesium. According to some embodiments, p-type dopant source layer 219 may be formed by implanting magnesium ions into a layer such as a semiconductor layer, a silicon layer, a group III nitride semiconductor layer, a metal oxide layer, a single crystal layer, a polycrystalline layer, and/or an amorphous layer. In addition, p-type dopant source layer 219 may be deposited by physical vapor deposition (PVD), electron beam evaporation, sputtering, pulsed laser deposition, chemical vapor deposition (CVD), and/or metal organic chemical vapor deposition (MOCVD).

Figure 2C:
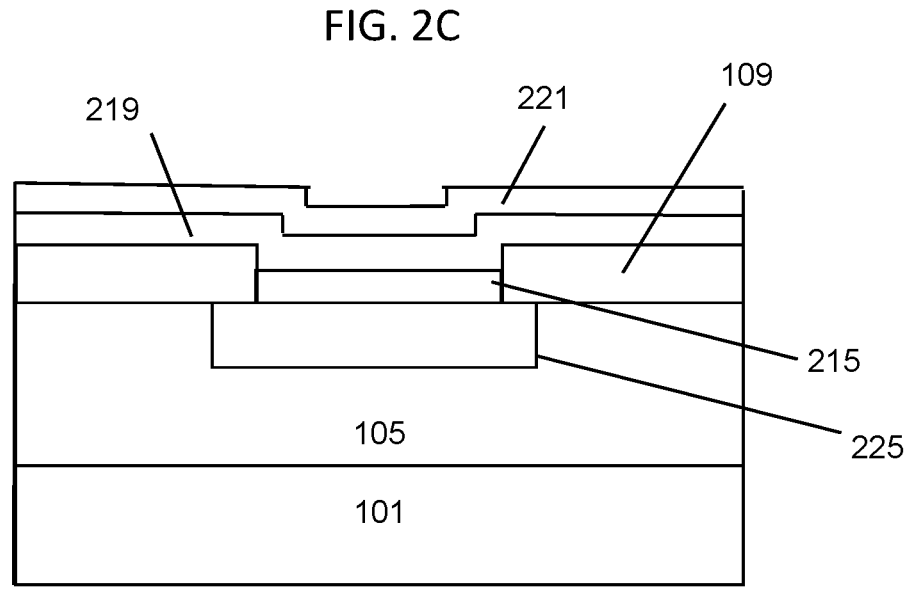

In FIG. 2C, capping layer 221 is formed on p-type dopant source layer 219, and then, the p-type dopant from p-type dopant source layer 219 is diffused through the n-type doped region 215 into semiconductor layer 105 to form p-type doped region 225 of semiconductor layer 105 (e.g., a magnesium doped region). For example, a multicycle rapid thermal anneal may be used for the diffusion to reduce and/or prevent decomposition of a group III nitride semiconductor material of semiconductor layer 105. Because a diffusion rate of the p-type dopant may be greater than a diffusion rate of the n-type dopant, p-type doped region 225 of semiconductor layer 105 may extend between n-type doped region 215 and the second surface of semiconductor layer 105, and p-type doped region 225 may also extend laterally beyond n-type doped region 215 under diffusion blocking layer 209. Moreover, capping layer 221 may include at least one of aluminum nitride, silicon nitride, aluminum oxide, silicon oxide, aluminum oxynitride, silicon carbide, palladium, platinum, gold, nickel, tungsten, molybdebum, and/or a refractory material. Capping layer 221, for example, may reduce and/or prevent decomposition of a group III nitride semiconductor material of semiconductor layer 105 during thermal operations used to diffuse and/or anneal n-type doped region 215 and/or p-type doped region 225.

Figure 2D:
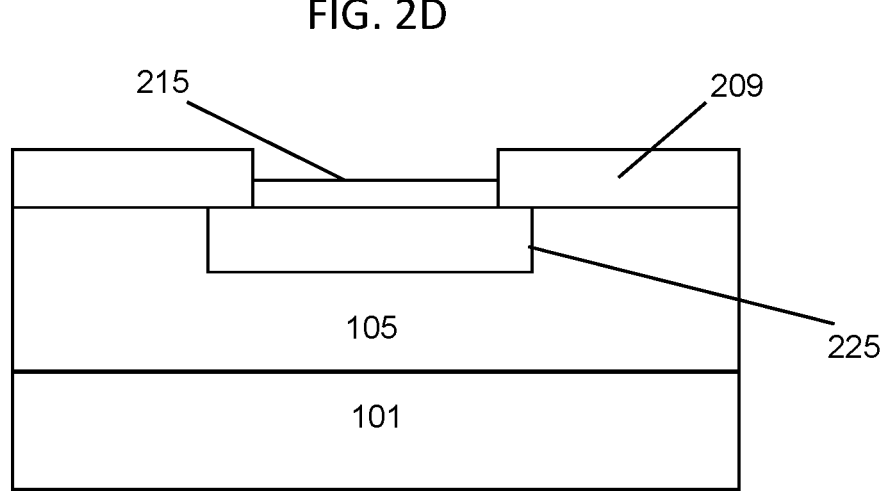

After diffusing the p-type dopant to form p-type doped region 225, capping layer 221 is removed, and then, p-type dopant source layer 219 is removed, as shown in FIG. 2D. According to some embodiments, diffusion blocking layer 109 may be removed, or diffusion blocking layer 109 may be maintained and incorporated in a final device structure.

In FIG. 2D, substrate 101 and n-type semiconductor layer 105 may each include respective n-type semiconductor materials, p-type doped region 225 may include a p-type semiconductor material, and n-type doped region 215 may include an n-type semiconductor material. Accordingly, n-type semiconductor layer 105, p-type doped region 225, and n-type doped region 215 may define an N—P—N structure. Such an N—P—N structure may be used to provide a vertical or a horizontal transistor device.

FIGS. 3A to 3D are cross sectional views illustrating operations of forming self-aligned n-type and p-type regions according to some embodiments of inventive concepts.

Figure 3A:
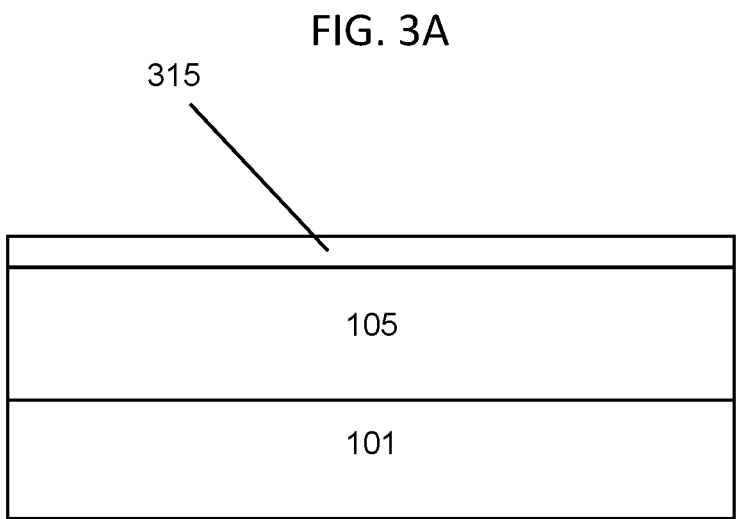
FIGS. 3A to 3D are cross sectional views illustrating operations of forming self-aligned n-type and p-type doped regions using blanket epitaxy and diffusion according to some embodiments of inventive concepts.

In FIG. 3A, substrate 101 and semiconductor layer 105 may be provided as discussed above with respect to FIGS. 1A and 2A. Layer 315 of an epitaxial n-type semiconductor material including an n-type dopant is formed on semiconductor layer 105. Layer 315 of the epitaxial n-type semiconductor material, for example, may include an n-type group III nitride epitaxial semiconductor layer including silicon dopant atoms and/or germanium dopant atoms.

Figure 3B:
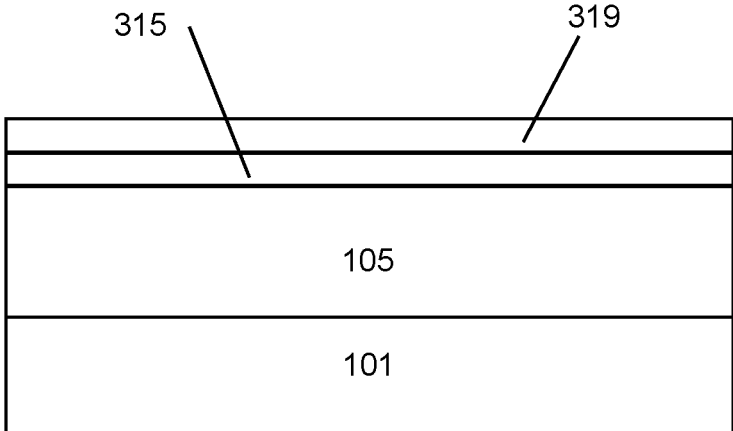

In FIG. 3B, layer 319 of a p-type dopant source material including a p-type dopant is formed on layer 315 of the epitaxial n-type semiconductor material. Moreover, layer 319 of the p-type dopant source material may be a layer of a material including a p-type dopant such as magnesium. For example, the p-type dopant source material may be a metal including magnesium, a metal alloy including magnesium, and/or a semiconductor alloy including magnesium. According to some embodiments, the p-type dopant source material may be formed by implanting magnesium ions into a layer such as a semiconductor layer, a silicon layer, a group III nitride semiconductor layer, a metal oxide layer, a single crystal layer, a polycrystalline layer, and/or an amorphous layer. In addition, the p-type dopant source material may be deposited by physical vapor deposition (PVD), electron beam evaporation, sputtering, pulsed laser deposition, chemical vapor deposition (CVD), and/or metal organic chemical vapor deposition (MOCVD).

Figure 3C:
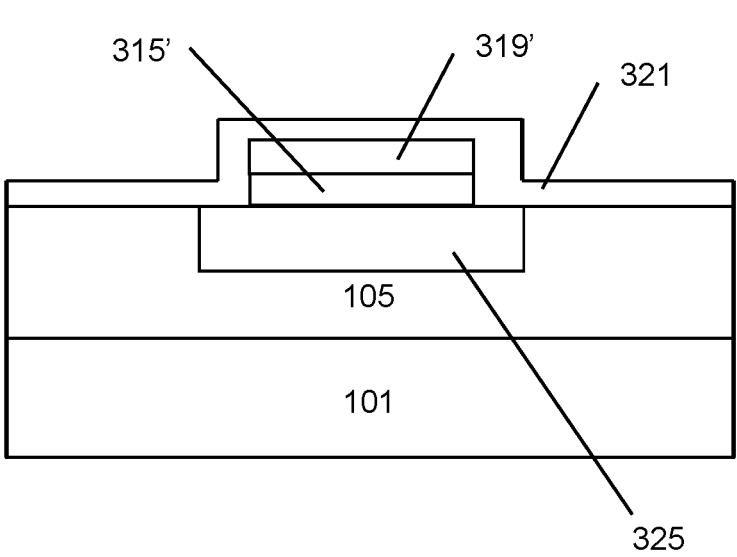

In FIG. 3C, layer 315 of the epitaxial n-type semiconductor material and layer 319 of the p-type dopant source material are patterned to form n-type doped region 315' including the n-type dopant and p-type dopant source layer 319' including the p-type dopant with n-type doped region 315' between p-type dopant source layer 319' and semiconductor layer 105. Capping layer 321 is then formed on p-type dopant source layer 319', on sidewalls of n-type doped region 315', and on portions of semiconductor layer 105 that are not covered by p-type dopant source layer 319' or n-type doped region 315'. Moreover, capping layer 321 may include at least one of aluminum nitride, silicon nitride, aluminum oxide, silicon oxide, aluminum oxynitride, silicon carbide, palladium, platinum, gold, nickel, tungsten, molybdebum, and/or a refractory material. Capping layer 321, for example, may reduce and/or prevent decomposition of a group III nitride semiconductor material of semiconductor layer 105 during thermal operations used to diffuse and/or anneal n-type doped region 315' and/or p-type doped region 325.

After forming capping layer 321, the p-type dopant from p-type dopant source layer 319' is diffused through the n-type doped region 315' into semiconductor layer 105 to form p-type doped region 325 of semiconductor layer 105 (e.g., a magnesium doped region). For example, a multicycle rapid thermal anneal may be used for the diffusion to reduce and/or prevent decomposition of a group III nitride semiconductor material of semiconductor layer 105. Because a diffusion rate of the p-type dopant may be greater than a diffusion rate of the n-type dopant, p-type doped region 325 of semiconductor layer 105 may extend between n-type doped region 315' and the second surface of semiconductor layer 105, and p-type doped region 325 may also extend laterally beyond n-type doped region 315' under capping layer 321.

Figure 3D:
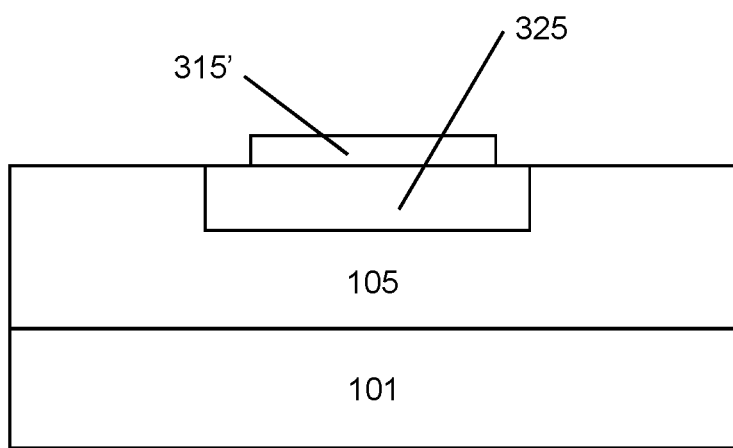

After diffusing the p-type dopant to form p-type doped region 325, capping layer 321 is removed, and then, p-type dopant source layer 319' is removed, as shown in FIG. 3D. In FIG. 3D, substrate 101 and n-type semiconductor layer 105 may each include respective n-type semiconductor materials, p-type doped region 325 may include a p-type semiconductor material, and n-type doped region 315' may include an n-type semiconductor material. Accordingly, n-type semiconductor layer 105, p-type doped region 325, and n-type doped region 315' may define an N—P—N structure. Such an N—P—N structure may be used to provide a vertical or a horizontal transistor device.

Figure 4A:
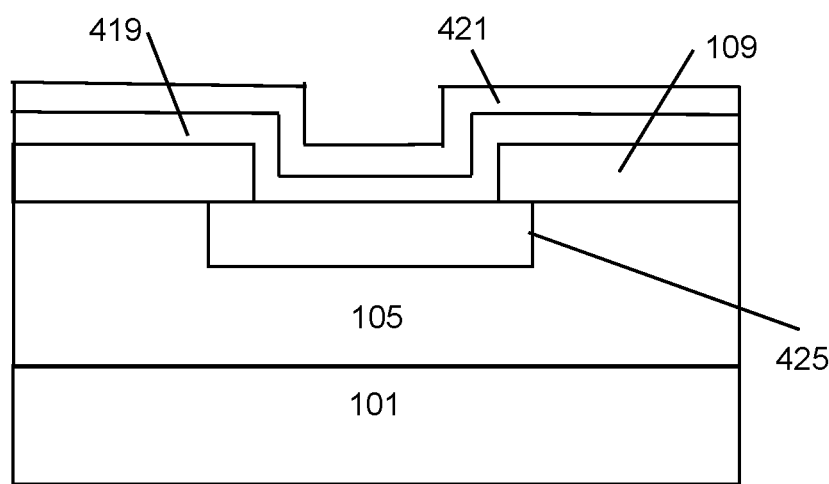
FIGS. 4A to 4C are cross sectional views illustrating operations of forming self-aligned n-type and p-type doped regions using diffusion, spacers, and an ion implant according to some embodiments of inventive concepts.
Figure 4B:
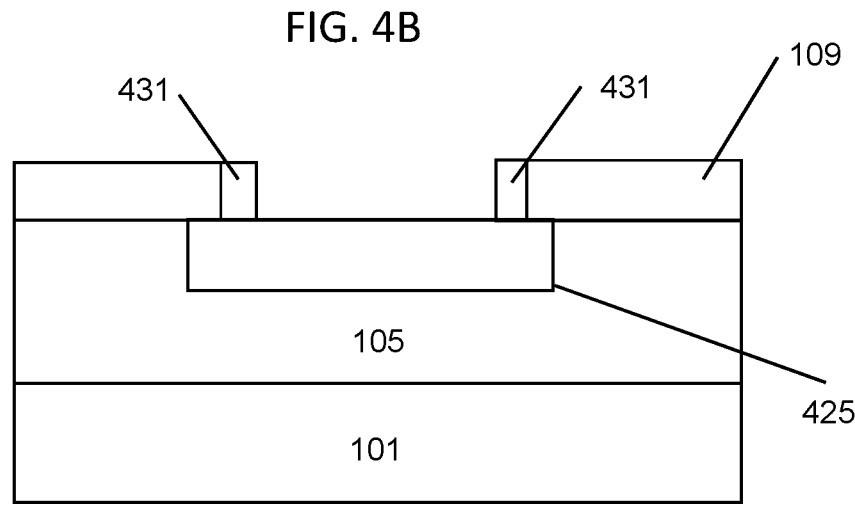

FIGS. 4A to 4B are cross sectional views illustrating operations of forming self-aligned n-type and p-type regions according to some embodiments of inventive concepts.

In FIG. 4A, substrate 101, semiconductor layer 105, and diffusion blocking layer 109 may be provided as discussed above with respect to FIG. 1A.

As shown in FIG. 4A, p-type dopant source layer 419 is formed on diffusion blocking layer 109 and in the opening of diffusion blocking layer 109 on semiconductor layer 105. Moreover, p-type dopant source layer 419 may be a layer of a material including a p-type dopant such as magnesium. For example, p-type dopant source layer 419 may be a metal including magnesium, a metal alloy including magnesium, and/or a semiconductor alloy including magnesium. According to some embodiments, p-type dopant source layer 419 may be formed by implanting magnesium ions into a layer such as a semiconductor layer, a silicon layer, a group III nitride semiconductor layer, a metal oxide layer, a single crystal layer, a polycrystalline layer, and/or an amorphous layer. In addition, p-type dopant source layer 419 may be deposited by physical vapor deposition (PVD), electron beam evaporation, sputtering, pulsed laser deposition, chemical vapor deposition (CVD), and/or metal organic chemical vapor deposition (MOCVD).

As further shown in FIG. 4A, capping layer 421 is formed on p-type dopant source layer 419, and then, the p-type dopant from p-type dopant source layer 419 is diffused into semiconductor layer 105 to form p-type doped region 425 of semiconductor layer 105 (e.g., a magnesium doped region). For example, a multicycle rapid thermal anneal may be used for the diffusion to reduce and/or prevent decomposition of a group III nitride semiconductor material of semiconductor layer 105. Moreover, capping layer 421 may include at least one of aluminum nitride, silicon nitride, aluminum oxide, silicon oxide, aluminum oxynitride, silicon carbide, palladium, platinum, gold, nickel, tungsten, molybdebum, and/or a refractory material. Capping layer 421, for example, may reduce and/or prevent decomposition of a group III nitride semiconductor material of semiconductor layer 105 during thermal operations used to diffuse and/or anneal p-type doped region 425.

After diffusing the p-type dopant to form p-type doped region 425, capping layer 421 is removed, and then, p-type dopant source layer 419 is removed, as shown in FIG. 4B. Spacers 431 are then be formed on sidewalls of diffusion blocking layer 109. Spacers 431, for example, may be formed by forming a blanket layer of insulating material on diffusion blocking layer 109, on sidewalls of diffusion blocking layer 109, and on exposed portions of p-type doped region 425, and then performing an isotropic etch operation so that only portions of the insulating material on sidewalls of diffusion blocking layer 109 remain. Because no separate photolithographic mask operation is required to form spacers 431, spacers 431 are self-aligned with respect to the opening through diffusion blocking layer 109. Spacers 431 may thus narrow the opening through diffusion blocking layer 109 to thereby reduce an area of the first surface of the semiconductor layer that is exposed for a subsequent ion implant operation.

Figure 4C:
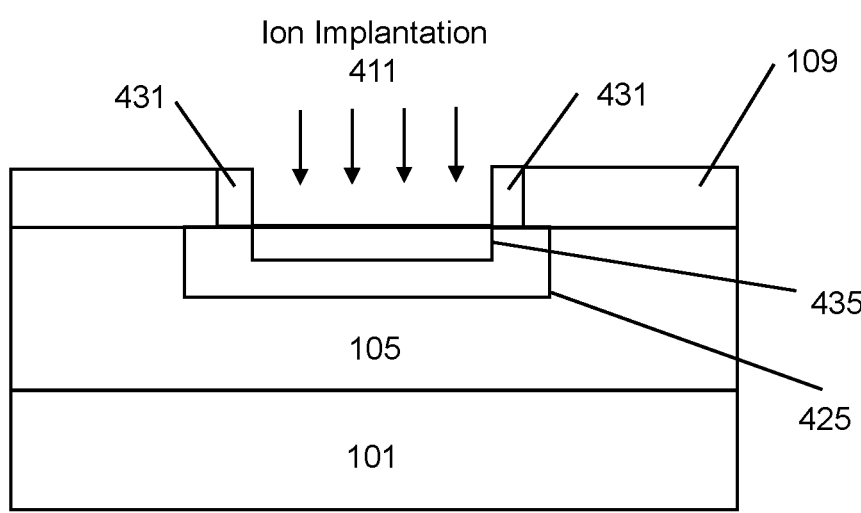

After forming spacers 431, an ion implant 411 is used to form n-type doped region 435 including an n-type dopant at the area of the first surface of semiconductor layer 105 defined by the opening in diffusion blocking layer 109 and spacers 431 as shown in FIG. 4C. More particularly, ions of the n-type dopant are implanted through the opening of diffusion blocking layer 109 and spacers 431 into the area of the first surface of semiconductor layer 105 defined by the opening to form n-type doped region 435 in semiconductor layer 105. The n-type dopant, for example, may include at least one of silicon and/or germanium, and n-type doped region 435 may be at least one of a silicon and/or germanium doped region. According to some other embodiments, n-type doped region 435 may be formed as an epitaxial layer on portions of p-type doped region 425 exposed between spacers 431.

According to some embodiments, diffusion blocking layer 109 and/or spacers 431 may be removed, or diffusion blocking layer 109 and/or spacers 431 may be maintained and incorporated in a final device structure.

Operations discussed above with respect to embodiments of FIGS. 1A-D, 2A-D, 3A-D, and 4A-C may thus be used to provide self-aligned p-type and n-type regions. As shown, such self-alignment may be provided along perimeters of the p-type and n-type regions at a surface of the semiconductor layer.

According to some other embodiments, such self-alignment may be provided along a first portion of the perimeter of the p-type and n-type regions, while a different alignment is provided along a second portion of the perimeter of the p-type and n-type regions. In FIGS. 1A and 1B, for example, a mask/etch operation may be performed after the ion implantation and before forming p-type dopant source layer 119 to widen the left side of the opening in the diffusion blocking layer 109 while protecting the right side of the opening.

Figure 5A:
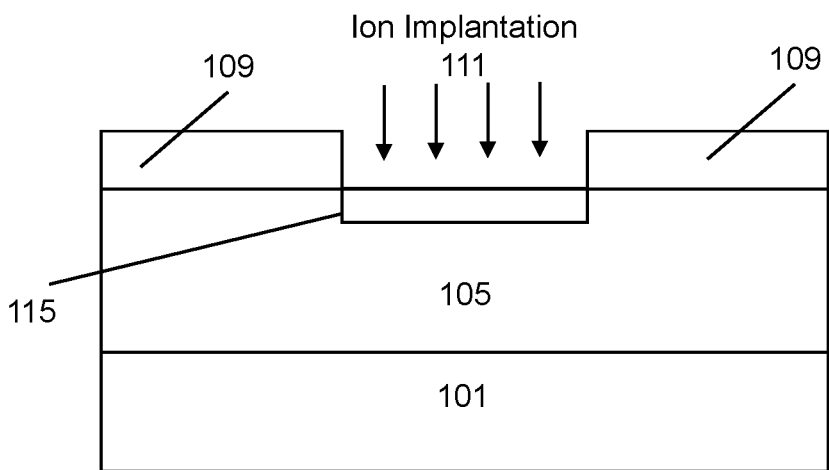
FIGS. 5A to 5D are cross sectional views illustrating operations of forming self-aligned n-type and p-type doped regions using an ion implant and diffusion according to some embodiments of inventive concepts.
Figure 5B:
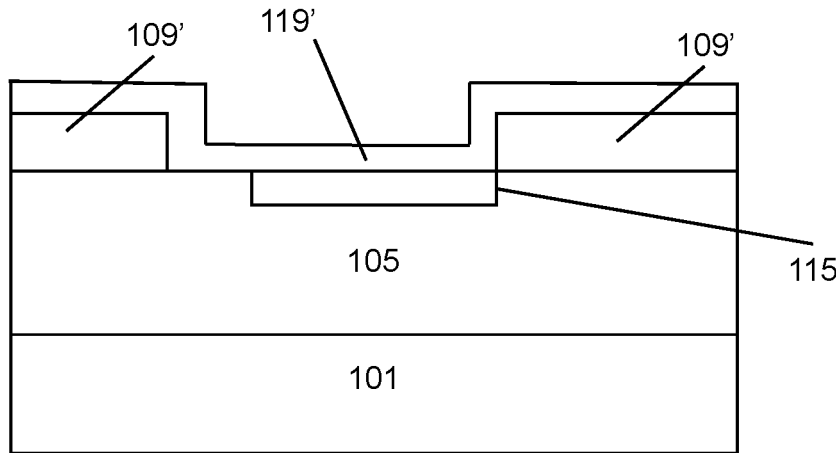

This alternative embodiment is shown in FIGS. 5A to 5D which respectively correspond to FIGS. 1A-D. FIG. 5A is the same as FIG. 1A, where substrate 101, semiconductor layer 105, diffusion blocking layer 109, ion implant 111, and n-type dopant region 115 are the same in FIGS. 1A and 5A. Moreover, substrate 101, semiconductor layer 105, and n-type dopant region 115 are the same in FIGS. 1A-D and 5A-D. In FIG. 5B, a mask/etch operation is added (relative to FIG. 1B) to widen the left portion of the opening through the diffusion blocking layer 109' before forming p-type dopant source layer 119'. Accordingly, a portion of semiconductor layer 105 to the left of n-type dopant region 105 may be in contact with p-type dopant source layer 119' before the diffusion operation. Other than the width of the opening through diffusion blocking layer 109' and the resulting change in dimension of p-type dopant source layer 119', however, diffusion blocking layer 109' and p-type dopant source layer 119' may the same as discussed above with respect to diffusion blocking layer 109 and p-type dopant source layer 119.

Figure 5C:
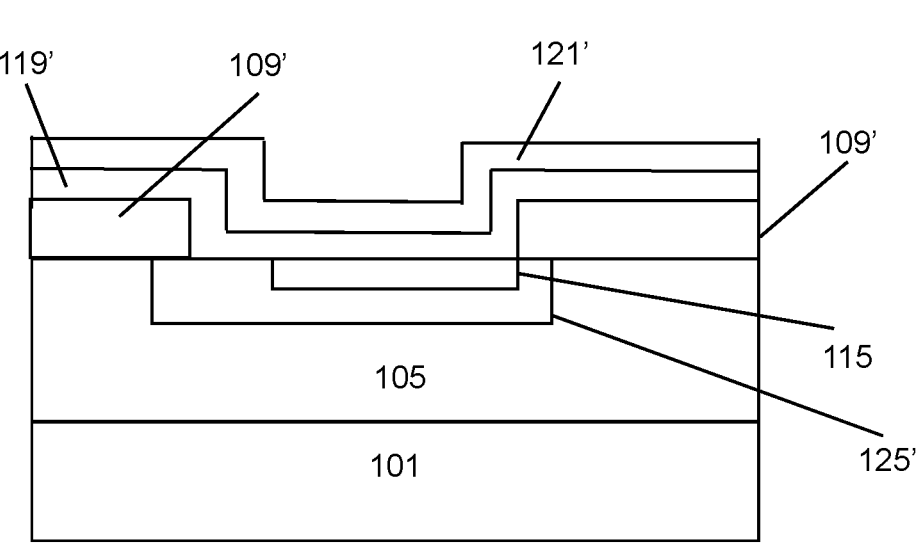
Figure 5D:
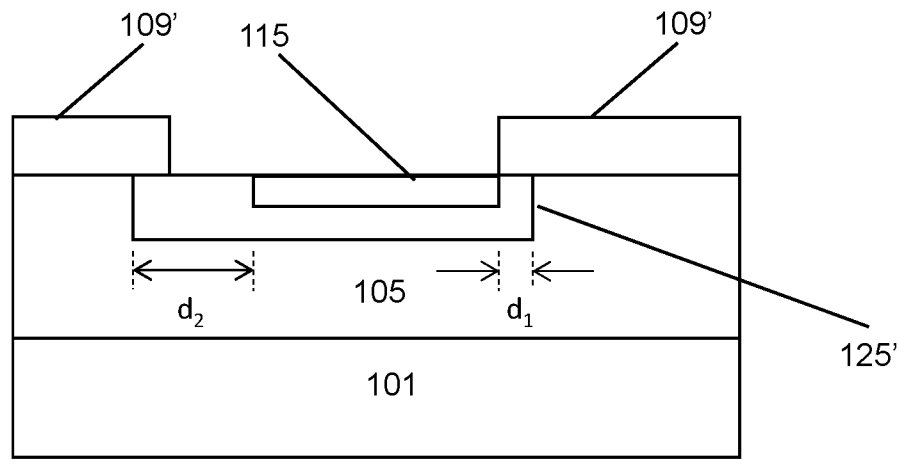

In FIG. 5C, capping layer 121' is formed, where the capping layer 121' may the same as capping layer 121 of FIG. 1C with the exception of changes in shape caused by the wider opening through diffusion blocking layer 109'. After forming capping layer 121', a diffusion operation is performed to diffuse the p-type dopant from p-type dopant source layer 119' through the opening defined by diffusion blocking layer 109' to form p-type doped region 125'. With the exception of the extension to the left, p-type doped region 125' may be the same as p-type doped region 125. In FIG. 5D, capping layer 121' and p-type dopant source layer 119' are removed. According to some embodiments, diffusion blocking layer 109' may also be removed.

As further shown in FIG. 5D, p-type doped region 125' may extend a distance d1 along a surface of semiconductor layer 105 beyond n-type doped region 105 (as shown to the right) where distance d1 is defined by self-alignment. In contrast, p-type doped region 125' may extend a distance d2 along a surface of semiconductor layer 105 beyond n-type doped region 105 (as shown to the left) where distance d2 is defined by the second mask/etch operation used to widen the opening through diffusion blocking layer 109'. Accordingly, self-aligned portions of n-type and p-type doped regions 115 and 125' (shown to the right in FIG. 5D) may provide a short distance d1 that is controllable (i.e., without dependence on a mask/etch operation) that may be used as a short channel for a field effect transistor. In contract, non-self-aligned portions of n-type and p-type doped regions 115 and 125' (shown to the left in FIG. 5D) that may provide a greater distance d2 with less control (i.e., dependent on a mask/etch operation) that may be used to provide room for contacts.

Similar modifications may be provided for embodiments of FIGS. 2A-D and/or FIGS. 3A-D. In FIG. 2A, for example, another mask/etch operation may be performed after forming n-type doped region 215 to remove portions of diffusion blocking layer 109 to the left of n-type doped region 215 before forming p-type dopant source layer 219 while maintaining all of the diffusion blocking layer 109 to the right of n-type doped region 215. With such modification of diffusion blocking layer 109, p-type doped region 225 may be modified to extend further to the left of n-type doped region 215 in FIGS. 2C and 2D. In FIG. 3C or 3D, for example, another mask/etch operation may be performed after forming p-type doped region 325 to remove portions of n-type doped region 315' to the left (increasing the extension of p-type doped region 325 beyond n-type doped region 315' to the left) while maintaining portions of n-type doped region 315' to the right (maintaining the short extension of p-type doped region 315' beyond n-type doped region 315' to the right).

Figure 6:
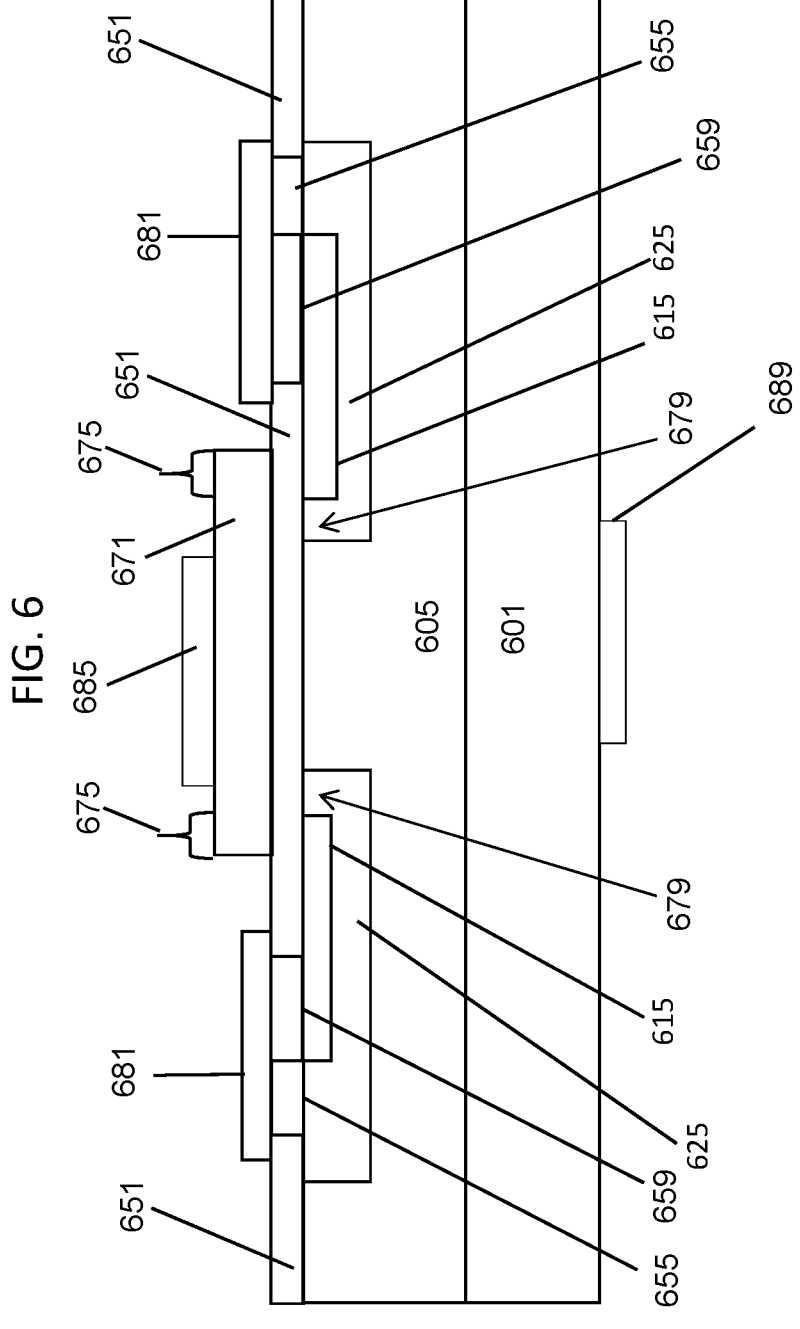
FIGS. 6 and 7 are cross sectional views illustrating field effect transistor devices according to some embodiments of inventive concepts.

FIG. 6 is a cross sectional view illustrating a vertical gallium nitride GaN field effect transistor (FET) including substrate 601, semiconductor layer 605, and self-aligned n-type and p-type doped regions 615 and 625 according to some embodiments of inventive concepts. Moreover, substrate 601, semiconductor layer 605, and self-aligned n-type and p-type doped regions 615 and 625 may be provided as discussed above with respect to FIGS. 5A to 5D after removing the diffusion blocking layer. In particular, substrate 601 may be an N+ gallium nitride substrate, and semiconductor layer 605 may be an N-type gallium nitride layer.

A continuous gate insulating layer may be formed on semiconductor layer 605 and then patterned to provide gate insulator 651. Ohmic metal contacts 655 for p-type material may be formed on portions of p-type doped regions 625 exposed through gate insulator 651, and ohmic metal contacts 659 for n-type material may be formed on portions of n-type doped regions 615 exposed through gate insulator 651. Different metals may thus be used to provide ohmic contact with the different conductivity type doped regions. Because an extension of outer portions of p-type doped regions 625 beyond n-type doped regions 615 may be defined by a separate mask (not used to define an extension of inner portions of p-type doped regions 625) as discussed above with respect to distance d2 in FIG. 5D, ohmic metal contacts 655 may be more easily formed on p-type doped regions 625. Gate electrode 671 (e.g., a polysilicon gate) may then be formed on gate insulator 651 with overlap regions 675 extending over portions of n-type doped regions 615.

Moreover FET channels 679 may be defined by extensions of inner portions of p-type doped regions 625 beyond n-type doped regions 615 under gate electrode 671. Accordingly, narrow/short widths of channels 679 may be accurately defined using self-alignment of n-type and p-type doped regions 615 and 625 as discussed above with respect to distance d1 in FIG. 5D. Such narrow/short FET channel widths may support higher current operation and/or smaller transistor sizes.

Source electrodes 681, metal gate electrode 685 (providing ohmic contact with gate 671), and metal drain electrode 689 (providing ohmic contact with substrate 601) may then be formed as shown in FIG. 6. FIG. 6 thus illustrates a vertical gallium nitride GaN field effect transistor FET with self-aligned n-type and p-type doped regions 615 and 625 providing FET sources and FET gates, and with semiconductor layer 605 providing a common FET drain. Moreover, the gate 671 overlaps sources 615 as indicated by overlap regions 675. In such a device, an electrical signal is applied to gate 671 to modulate a current flow through channels 679 of P-wells provided by p-type doped regions 625 at an interface between p-type doped regions 625 and gate insulator 651. When turned on, current flows through source electrodes 681 and ohmic metal contacts 659, through sources provided by n-type doped regions 615, through channels 679 of p-type doped regions 625, through the common drain provided by semiconductor layer 605, through substrate 601, and through drain electrode 689. This is referred to as a "vertical" device because current flows between electrodes on opposite sides of substrate 601.

Figure 7:
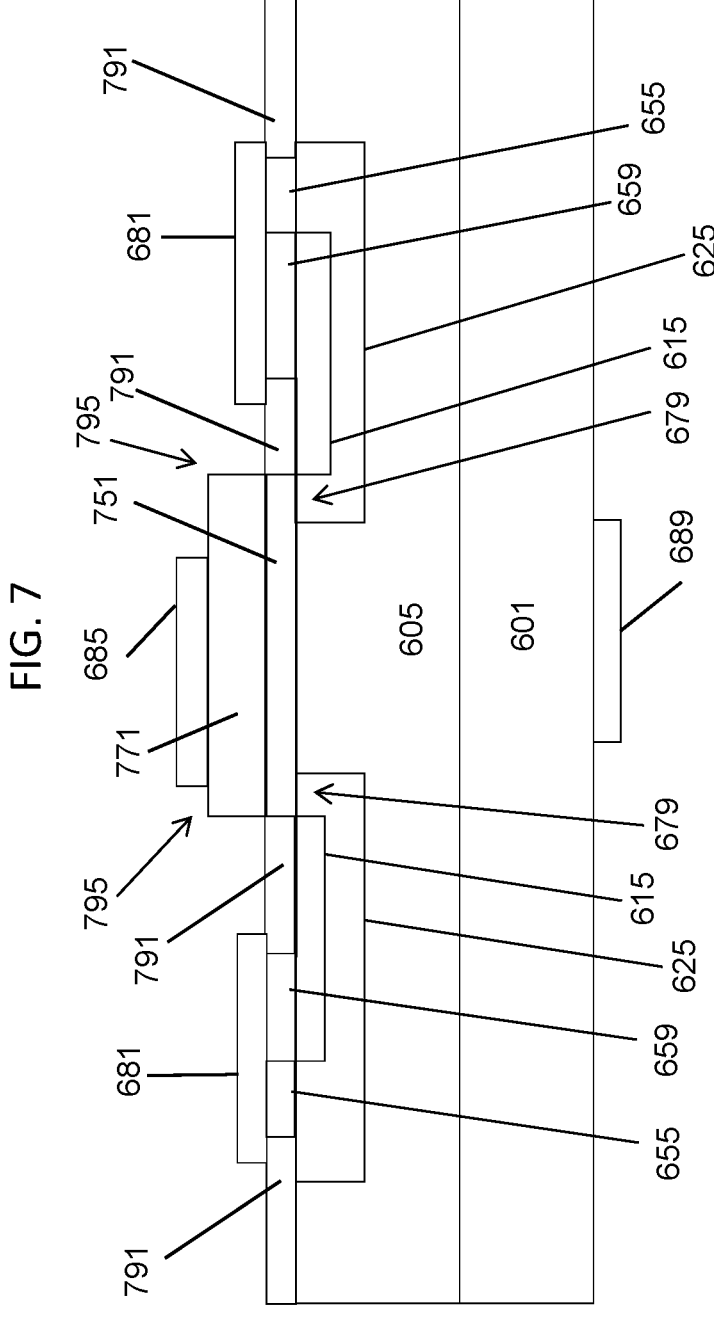

FIG. 7 is a cross sectional view illustrating a vertical gallium nitride GaN field effect transistor (FET) with n-type doped regions 615, p-type doped regions 625, gate insulator 751, and gate 771 that are self-aligned. In FIG. 7, drain electrode 689, substrate 601, semiconductor layer 605, p-type doped regions 625, n-type doped regions 615, channels 679, ohmic metal contacts 655 and 659, and gate electrode 685 may be substantially the same as the corresponding elements discussed above with respect to FIG. 6. In FIG. 7, however, edges 795 of gate 771 and/or gate insulator 751 may be self-aligned with respect to corresponding edges of n-type doped region 615 and/or p-type doped region 679.

For example, n-type doped regions 615 and p-type doped regions 625 may be formed as discussed above with respect to n-type doped region 115 and p-type doped region 125' as discussed above with respect to FIGS. 5A to 5D. In addition, a continuous gate insulating layer (e.g., a layer of silicon oxide) and a continuous gate layer (e.g., a layer of polysilicon) may be formed on semiconductor layer 105 before forming diffusion blocking layer 109, and each mask/etch operation used to pattern diffusion blocking layer 109/109' may also pattern the gate insulating layer and the gate layer so that the resulting structure of FIG. 5D includes patterned gate insulating and gate layers between diffusion blocking layer 109' and semiconductor layer 105. Diffusion blocking layer 109' may then be removed, and portions of patterned gate insulating and gate layers that are remote from channels (e.g., on the left side of FIG. 5D may be removed so that the self-aligned gate insulator 751 and gate 771 remain as shown in FIG. 7. Passivation layer 791 may then be formed/patterned before forming Electrical operation of the device of FIG. 7 is the same as that discussed above with respect to FIG. 6.

N-type doped regions are discussed below.

An N-type doped region including a silicon dopant and/or a germanium dopant may be formed within a III-nitride semiconductor material (e.g., using ion implantation) or may be formed on the III-nitride semiconductor material (e.g., using epitaxial growth). The N-type doped region may include at least one of: an N-type ion implanted and annealed region of the III-nitride semiconductor material; a selectively grown N-type III-nitride epitaxial semiconductor layer; and/or an N-type III-nitride epitaxial semiconductor layer that is patterned/etched.

When using an N-type ion implanted and annealed region, silicon atoms and/or germanium atoms may be implanted into the III-nitride semiconductor material, and an annealing operation may be performed. A capping layer may be provided on the III-nitride semiconductor material after the implant and before the annealing operation to reduce and/or prevent decomposition of the III-nitride semiconductor material during the annealing operation. In addition or in an alternative, a multicycle rapid thermal annealing operation may be used (with or without the capping layer) to reduce and/or prevent decomposition of the surface of the III-nitride semiconductor material. In addition, the silicon and/or germanium ions may be implanted through a protective layer on the surface of the III-nitride semiconductor material to protect the III-nitride semiconductor material surface during ion implantation. Stated in other words, the protective layer may be formed on the surface of the III-nitride semiconductor material before the implant, the silicon and/or germanium ions may be implanted through the protective layer into the III-nitride semiconductor material, and the protective layer may be removed either before forming the capping layer or after performing the anneal.

When using a selectively grown N-type III-nitride epitaxial semiconductor layer, the selectively grown N-type III-nitride epitaxial semiconductor layer including silicon dopant atoms and/or germanium dopant atoms may be grown on the III-nitride semiconductor material.

When using an etched/patterned N-type III-nitride epitaxial semiconductor layer, an N-type III-nitride epitaxial semiconductor layer comprising silicon atoms and/or germanium atoms may be formed to provide an N-type III-nitride epitaxial semiconductor layer on the III-nitride semiconductor layer, and then the N-type III-nitride epitaxial semiconductor layer may be laterally defined by selectively etching through the N-type III-nitride semiconductor layer, and the N-type III-nitride semiconductor layer may be self-aligned to a laterally defined diffusion source layer including magnesium.

Diffused P-type doped regions are discussed below.

In some embodiments, the diffused P-type regions may be formed by magnesium diffusion. The diffused P-type region within the III-nitride semiconductor material may be formed by diffusion of magnesium from a diffusion source layer including magnesium into a surface of the III-nitride semiconductor material. In some embodiments, the region of magnesium diffusion is laterally defined by an opening in a magnesium diffusion blocking layer with a diffusion source layer including magnesium deposited on top of the magnesium diffusion block layer and within the opening in the magnesium diffusion blocking layer. In some embodiments, the diffusion source layer including magnesium may be laterally defined by photolithography and subtractive etching operations and/or by photolithography and liftoff operations.

The diffused P-type region is formed so that it is at a greater depth into the III-nitride semiconductor material than the N-type region. The diffused P-type doped region may also extend further laterally than the N-type doped region. The faster diffusion rate of magnesium in the III-nitride semiconductor material relative to that of silicon in the III-nitride semiconductor material may be used to form a structure in which the diffused P-type region extends further laterally than the N-type doped region and in which the diffused P-type region also extends further vertically into the III-nitride semiconductor material than the N-typed doped region. A structure may thus be formed in which there is: an N-type region at an upper surface of the III-nitride semiconductor material; a diffused P-type region below the N-type region; and an N-type III-nitride semiconductor region beneath the diffused P-type region. The resulting structure may thus provide an N—P—N structure that is a desired structure for many devices.

In some embodiments, the diffused P-type region is formed prior to forming the N-type region. In some embodiments, the P-type diffused region is formed after forming the N-type doped region and the P-type diffusion proceeds through the N-type region and diffuses further vertically and laterally into the III-nitride semiconductor material than the N-type region.

The magnesium dopant may be diffused from a diffusion source layer including magnesium that provides a source for magnesium diffusion (also referred to as a magnesium source layer). According to some embodiments, the diffusion source layer including magnesium may be a metal including magnesium, a metal alloy including magnesium, and/or a semiconductor alloy including magnesium. According to some embodiments, the diffusion source layer including magnesium may be formed by implanting magnesium ions into a layer such as a semiconductor layer, a silicon layer, a III-nitride semiconductor layer, a metal oxide layer, a single crystal layer, a polycrystalline layer, and/or an amorphous layer.

The diffusion source layer including magnesium may deposited by physical vapor deposition, electron beam evaporation, sputtering, pulsed laser deposition, chemical vapor deposition, metal organic chemical vapor deposition, and/or other techniques known to those skilled in the art, followed by subsequent capping with a thermally stable layer (also referred to as a capping layer) to reduce and/or prevent decomposition and/or out-diffusion.

The annealing operation for the magnesium diffusion may be based on diffusion of dopant species by annealing under stable and/or metastable conditions.

III-Nitride semiconductor materials on a substrate are discussed below.

The III-nitride semiconductor layer on the substrate may include an epitaxial gallium nitride layer on gallium nitride, a high aluminum III-nitride semiconductor on gallium nitride, and/or a III-nitride epitaxial semiconductor layer on an engineered substrate.

Magnesium diffusion blocking layers are discussed below.

The magnesium diffusion blocking layer may include one or more of a silicon oxide layer, a silicon nitride layer, a silicon carbide layer, an aluminum nitride layer, an aluminum oxide layer, an aluminum oxynitride layer, a carbon layer, a layer of a refractory material, a layer of an amorphous material, a composite layer, a layer of a polycrystalline material, and/or one or more layers of other materials. The magnesium diffusion blocking layer may also be used to facilitate the selective epitaxial growth of the N-type III-nitride epitaxial semiconductor layer. The surface of the magnesium blocking layer may be a silicon nitride layer or other layer of another material that facilitates the selective epitaxial growth of the N-type III-nitride epitaxial semiconductor layer.

Materials for spacers are discussed below.

A spacer may be formed by depositing a layer of a spacer material and then performing an anisotropic plasma etch on the deposited layer of the spacer material. The spacer may thus be used to increase a lateral displacement of the edge of the N-type doped region from the edge of the diffused P-type doped region without using a separate photolithography/mask operation. In some embodiments, a material layer may be used to protect the III-nitride semiconductor surface from plasma etch damage during the anisotropic plasma etch operation used to form the spacer. In some embodiments, the spacer may be formed and then the following operations may be performed: implanting silicon ions; forming a cap layer; and performing an annealing operation. In some embodiments, the spacer may be formed, and then a selective N-type III-nitride epitaxial semiconductor layer may be grown.

Self-alignment of N-type and P-type doped regions to a gate edge is discussed below.

In some embodiments, N-type and P-type doped regions can be self-aligned with respect to each other, and also the N-type doped region can be self-aligned with the edge of a gate electrode on at least one edge. A gate insulator layer may separate the gate electrode from the N-doped region and the diffused P-type region. In some embodiments, an optional spacer may be formed at the edge of the gate electrode. In some embodiments, a gate structure may laterally overlap the edge of an N-type doped regions. A gate insulator layer will separate the gate electrode from the N-doped region and the diffused P-type region.

The gate electrode may include a metal layer, a doped polycrystalline layer, a metal oxide layer, a III-nitride semiconductor layer, and/or a layer of another material. In some embodiments, the gate electrode may include a layer of a P-type semiconductor material that helps facilitate a normally-off power switch. In such embodiments, the P-type gate electrode may include a layer of a P-type metal oxide, a layer of P-type polysilicon, a layer of a P-type III-nitride semiconductor, and/or a layer of a metal with a high value of the work function.

According to some embodiments of inventive concepts, device structures may be implemented using N-type and P-type doped regions where the N-type doped region is self-aligned to the diffused P-type doped region. One such device structure is a Field Effect Transistor (FET) that includes an N-type doped region that may be a source, a diffused P-type doped regions that may optionally be a diffused P-well, a gate insulator, an electrically conductive gate electrode, and metal contacts to the N-type and diffused P-type doped regions that can be ohmic or Schottky electrodes.

The gate structure of the field effect transistor may or may not be self-aligned with respect to the N-type or P-type doped regions. In some embodiments, the gate structure will not be self-aligned with respect to the gate structure and may laterally overlap the N-type doped region. In other embodiments, the N-type doped region may be self-aligned with respect to the gate structure. In still other embodiments, the N-type doped region and the P-type doped region may be self-aligned with respect to the gate structure.

The gate insulator may include a layer of a silicon oxide material, a layer of a metal oxide material, and/or a layer of a III-nitride semiconductor material.

An electrical ohmic contact may be formed by defining a first portion of the P-type region which does not have N-type dopant formed within or above the P-type region or by etching through the N-type region that is formed on or within the first portion of the P-type region. A second portion of the P-type doped region without N-type dopant can intersect with the P-type well region to contact the first P-type well region.

The diffused P-type doped region can be used to adjust a threshold voltage of the field effect transistor.

The diffused P-type doped region according to some embodiments of present inventive concepts may be used to provide P-type regions of a Reduced Surface Electric Field (RESURF) power switch, and/or diffused P-type regions of a super junction field effect transistor.

While example embodiments are shown for Field Effect Transistor devices, operations and structures of the present disclosure can be used for other vertical and/or lateral device architectures, including junction barrier Schottky (JBS) diodes, p-n junction gated field effect transistors (JFET), current aperture vertical electron transistors (CAVET), double diffused metal oxide semiconductor field effect transistors (DMOS), and/or trench MOSFET devices.

Self-aligned N-type and P-type doped regions according to some embodiments of inventive concepts may thus enable one or more of the following features/advantages.

According to some embodiments, an N+ source and an N-type drift layer may be closely spaced, so that a width of a channel between an edge of the N+ source to an edge of the P-type magnesium diffused well is reduced to provide a short channel field effect transistor. Stated in other words, the field effect transistor channel may be defined through the P-type magnesium diffused well at a surface of the III-nitride semiconductor material between the edge of the N+ source and the N-type drift layer.

According to some embodiments, field effect transistors with reduced lateral dimensions may be provided.

According to some embodiments, double diffused field effect transistors and/or lateral diffused field effect transistors may be provided with reduced lateral dimensions.

According to some embodiments, field effect transistors with increased frequency operation may be provided.

While examples of embodiments are disclosed for Field Effect Transistor devices, operations/structures of present inventive concepts may be used for other vertical and/or lateral device architectures, including junction barrier Schottky (JBS) diodes, p-n junction gated field effect transistors (JFET), current aperture vertical electron transistors (CAVET), double diffused metal oxide semiconductor field effect transistors (DMOS), and trench MOSFET devices.

Self-aligned n-type and p-type doped regions may thus be useful for high performance power switching devices. As discussed above, p-type doped regions may be formed by diffusing magnesium into a group III nitride semiconductor layer, and magnesium may have a high diffusion rate in such materials. N-type doped regions may be formed by ion implantation, selective epitaxy, and/or etched message processes, and n-type dopants (such as silicon and/or germanium) may have negligible diffusion rates in group III nitride semiconductor materials (relative to diffusion rates of magnesium). According to self-aligned patterning processes disclosed herein, a same opening (or portions of a same opening) in a diffusion blocking layer may be used to form both the n-type and p-type doped regions that are self-aligned.

As discussed above, methods and structures disclosed herein may be used for lateral and/or vertical field effect transistors. Moreover, such methods and/or structures may be used for P-i-N diodes, for lateral and/or vertical power switches, for edge termination and/or contact formation in lateral and/or vertical device architectures, and/or for junction barrier Schottky (JBS) diodes.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present. Moreover, if an element is referred to as being "on" another element, no spatial orientation is implied such that the element can be over the other element, under the other element, on a side of the other element, etc.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted/diffused region illustrated as a rectangle will, typically, have rounded or curved features and/or a gradient of implant/diffusion concentration at its edges rather than a binary change from implanted to non-implanted region. Likewise, a buried region formed by implantation/diffusion may result in some implantation/diffusion in the region between the buried region and the surface through which the implantation/diffusion takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the inventive concepts herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While inventive concepts have been particularly shown and described with reference to examples of embodiments thereof, it will be understood that various changes in form and details may be made therein without departing from the spirit of the following claims.

The invention claimed is:

1. A method of forming a semiconductor device on a semiconductor layer having opposing first and second surfaces, the method comprising:

forming an n-type doped region comprising an n-type dopant at the first surface of the semiconductor layer;

forming a p-type dopant source layer comprising a p-type dopant on the n-type doped region;

diffusing the p-type dopant from the p-type dopant source layer through the n-type doped region into the semiconductor layer to form a p-type doped region of the semiconductor layer, wherein the p-type doped region of the semiconductor layer is between the n-type doped region and the second surface of the semiconductor layer; and after diffusing the p-type dopant, removing the p-type dopant source layer.

2. The method of claim 1 further comprising:

before forming the n-type doped region, forming a diffusion blocking layer on the first surface of the semiconductor layer, wherein the diffusion blocking layer has an opening there through defining an area of the first surface of the semiconductor layer;

wherein forming the n-type doped region comprises forming the n-type doped region at the area of the first surface of the semiconductor layer defined by the opening;

wherein forming the p-type dopant source layer comprises forming the p-type dopant source layer on the diffusion blocking layer and in the opening of the diffusion blocking layer on the n-type doped region.

3. The method of claim 2, wherein forming the n-type doped region comprises implanting ions of the n-type dopant through the opening of the diffusion blocking layer into the area of the semiconductor layer defined by the opening to form the n-type doped region in the semiconductor layer.

4. The method of claim 2, wherein forming the n-type doped region comprises selectively forming an epitaxial n-type semiconductor layer comprising the n-type dopant on the area of the semiconductor layer defined by the opening to form the n-type doped region on the semiconductor layer.

5. The method of claim 2 further comprising:

after removing the p-type dopant source layer, removing the diffusion blocking layer.

6. The method of claim 2, wherein the diffusion blocking layer comprises at least one of silicon oxide, silicon nitride, silicon carbide, aluminum nitride, aluminum oxide, aluminum oxynitride, carbon, and/or a refractory material.

7. The method of claim 1 further comprising:

forming a layer of an epitaxial n-type semiconductor material comprising the n-type dopant on the semiconductor layer;

forming a layer of a p-type dopant source material comprising the p-type dopant on the layer of the epitaxial n-type semiconductor material;

after forming the layers of the epitaxial n-type semiconductor material and the p-type dopant source material, patterning the layers of the epitaxial n-type semiconductor material and the p-type dopant source material to form the n-type doped region and the p-type dopant source layer with the n-type doped region between the p-type dopant source layer and the semiconductor layer.

8. The method of claim 7 further comprising:

after forming the p-type dopant source layer and before diffusing the p-type dopant, forming a capping layer on the p-type dopant source layer and on portions of the semiconductor layer adjacent to the p-type dopant source layer; and after diffusing the p-type dopant and before removing the p-type dopant source layer, removing the capping layer.

9. The method of claim 8, wherein the capping layer comprises at least one of silicon oxide, silicon nitride, silicon carbide, aluminum nitride, aluminum oxide, aluminum oxynitride, carbon, palladium, platinum, gold, nickel, tungsten, molybdenum, and/or a refractory material.

10. The method of claim 1, wherein the semiconductor layer comprises a Group III nitride semiconductor layer.

11. The method of claim 10, wherein the Group III nitride semiconductor layer comprises at least one of gallium nitride (GaN), aluminum gallium nitride (AlGaN), indium aluminum gallium nitride (InAlGaN), and/or aluminum nitride (AlN).

12. The method of claim 1, wherein the semiconductor layer comprises an n-type semiconductor layer, and wherein the n-type doped region, the p-type doped region, and the n-type semiconductor layer define an N-P-N structure after diffusing the p-type dopant.

13. The method of claim 1, wherein the n-type dopant comprises at least one of silicon and/or germanium.

14. The method of claim 1, wherein the p-type dopant comprises magnesium, and wherein the p-type dopant source layer comprises magnesium.

15. The method of claim 14, wherein forming the p-type dopant source layer comprising magnesium comprises at least one of forming a metal layer comprising magnesium, forming a layer of a metal alloy comprising magnesium, forming a layer of a semiconductor alloy comprising magnesium, implanting magnesium into a layer of a material, forming a layer of a semiconductor comprising magnesium, forming a layer of silicon comprising magnesium, forming a layer of a group-III nitride comprising magnesium, forming a layer of a metal oxide comprising magnesium, forming a layer of a metal nitride including magnesium, forming a layer of a metal fluoride including magnesium, forming a layer of a metal phosphide including magnesium, forming a layer of a metal sulfide including magnesium, forming a layer of a single crystal material comprising magnesium, forming a layer of a polycrystalline material comprising magnesium, and/or forming a layer of an amorphous material comprising magnesium.

16. The method of claim 14, wherein forming the p-type dopant source layer comprises forming the p-type dopant source layer using at least one of physical vapor deposition (PVD), electron beam evaporation, sputtering, pulsed laser deposition, chemical vapor deposition (CVD), and/or metal organic chemical vapor deposition (MOCVD).

17. The method of claim 1 further comprising:

after forming the p-type dopant source layer and before diffusing the p-type dopant, forming a capping layer on the p-type dopant source layer; and after diffusing the p-type dopant and before removing the p-type dopant source layer, removing the capping layer.

18. The method of claim 17, wherein the capping layer comprises at least one of silicon oxide, silicon nitride, silicon carbide, aluminum nitride, aluminum oxide, aluminum oxynitride, carbon, palladium, platinum, gold, nickel, tungsten, molybdenum, and/or a refractory material.

* * * * *